United States Patent [19]

Kuno

[11] 3,842,292

[45] Oct. 15, 1974

[54] MICROWAVE POWER MODULATOR/LEVELER CONTROL CIRCUIT

[75] Inventor: Hiromu John Kuno, Palos Verdes Peninsula, Calif.

[73] Assignee: Hughes Aircraft Company, Culver City, Calif.

[22] Filed: June 4, 1973

[21] Appl. No.: 367,075

[52] U.S. Cl................... 307/271, 328/155, 328/181, 333/17, 333/81 B, 332/37 R, 317/235 AD

[51] Int. Cl............................................... H03b 3/04

[58] Field of Search........... 333/17, 81 B; 332/37 D, 332/37 R; 328/155, 181; 307/271; 317/235 AD

[56] References Cited

UNITED STATES PATENTS

| | | | |
|---|---|---|---|
| 2,808,569 | 10/1957 | Morrison | 332/37 D |
| 2,983,883 | 5/1961 | Luhrs | 333/81 B X |
| 3,200,336 | 8/1965 | Valakos et al | 332/37 R |
| 3,404,355 | 10/1968 | Berteaud et al | 333/81 B |
| 3,486,128 | 12/1969 | Lohrmann | 332/37 R |
| 3,737,809 | 6/1973 | Parkyn | 332/37 R |
| 3,753,160 | 8/1973 | Safran | 333/17 |

*Primary Examiner*—John S. Heyman
*Attorney, Agent, or Firm*—W. J. Bethurum; W. H. MacAllister

[57] ABSTRACT

Disclosed is a microwave modulator and leveler including automatic gain control (AGC) circuitry for providing closed loop amplitude control of microwave power propagated through the modulator. In addition to this power amplitude control, the control circuitry for the modulator features automatic and external modulation of microwave power, and also a frequency indication control. Separate control networks for these different control functions are all connected in a unique fashion to a single common control or bias winding of the modulator.

18 Claims, 14 Drawing Figures

MICROWAVE POWER MODULATOR/LEVELER CONTROL CIRCUIT

FIELD OF THE INVENTION

This invention relates generally to sweep oscillators and associated modulators for the generation and control, respectively, of microwave or millimeter wave power. More particularly, the invention is directed to new and useful improvements in modulation and AGC control circuitry for these modulators, which circuitry performs a plurality control and frequency indication functions.

BACKGROUND

Microwave and millimeter wave sweep oscillators and associated microwave signal processing components necessary for producing a power leveled output signal are generally known in the art. A typical system for providing a leveled output power will include a sweep oscillator, such as an IMPATT diode-type sweep oscillator, driven by a sawtooth wave generator to sweep the oscillator through a given frequency range. The instantaneous oscillator frequency is dependent upon the level of DC bias current through the oscillator's IMPATT diode, and this DC bias current is, in turn, dependent upon the instantaneous amplitude of the sawtooth voltage of the sawtooth generator. So the periodic sawtooth voltage waveform can be used to sweep the oscillator frequency at various rates, depending upon the exact shape and slope of the sawtooth waveform. This sweeping is, of course, repeated for each individual sawtooth voltage at the output of the sawtooth wave generator.

This type of sweep oscillator and its associated signal processing circuitry serve many useful sweep frequency functions in certain kinds of electronic test equipment. Such equipment may be used, for example, as a variable frequency local oscillator for driving a mixer into which an input microwave or millimeter wave signal is applied. The intermediate frequency (IF) signal at the output of the mixer may, using this scheme, be swept through a chosen frequency range directly in accordance with the frequency variations of the local oscillator. Alternatively, this type of microwave or millimeter wave test equipment may advantageously be used in driving various types of filters in order to measure the frequency response thereof. Therefore, the substantial utility of these sweep oscillators and their associated modulators and control circuits is manifest.

PRIOR ART

Sweep oscillators of the above type will, as mentioned, typically be coupled to associated equipment such as a modulator and leveler stage, and this coupling may be achieved using a conventional ferrite isolator stage. This modulator and leveler stage (hereinafter the modulator/leveler) is used both for the purpose of modulating the output microwave of millimeter wave signal from the sweep oscillator with either an analog or digital modulating signal and also for connection to a suitable AGC feedback control loop for leveling the propagated signal by a chosen amount. This leveling is necessary as a result of the fact that the power levels at the output of the sweep oscillator change with oscillator frequency, and some form of automatic gain control (AGC) is required in a closed loop around either some portion of the sweep oscillator or the modulator/leveler stages, or both. The modulator/leveler is conventionally coupled through a directional coupler or the like to an output port of the test equipment, and typically, a diode detector will be connected to this directional coupler to sample a portion of output power and to provide a level control feedback voltage for processing in the above mentioned AGC control loop.

One prior art sweep oscillator and associated modulator scheme known to me for accomplishing the above AGC control includes a PIN diode modulator which is coupled through an isolator stage to output of the main sweep oscillator. The AGC feedback circuit for this arrangement includes a diode detector connected to a directional coupler, as mentioned, at the output of the PIN modulator. The feedback circuitry further includes some voltage comparison means connected between the output of the diode detector and one imput of the PIN modulator for applying an error voltage to the modulator proportional to changes in the microwave power level at the output of the directional coupler. This comparison means typically includes a differential operational amplifier which is connected at one input terminal through one coaxial cable to the diode detector and connected at its other input terminal through another coaxial cable to a reference voltage potentiometer. The latter is, of course, used for varying the threshold response of the differential operational amplifier.

One disadvantage with the above prior art AGC feedback technique is that the two coaxial cables connected respectively to the two inputs of the differential operational amplifier introduce delays into the error signal thus produced, and this prevents a tight closed loop AGC control over the power levels of signals propagated through the modulator. Furthermore, rapid increases in the RF power at the output of the directional coupler introduce further delays into the feedback signal, thereby causing either overshoot or oscillation or both in the differential amplifier stage. These in turn result in overshoot or instability in the feedback loop and in the output power. In addition to these problems, the prior art level control feedback control systems did not include any convenient means for making the necessary adjustments to compensate for variations in the detector sensitivity and in the oscillator power range.

THE INVENTION

The general purpose of the present invention is to provide new and improved control circuitry for a sweep oscillator and its associated modulator/leveler, and circuitry which possesses most, if not all, of the advantages of similarly employed prior art control circuits, while possessing none of their aforedescribed significant disadvantages. To attain this purpose, I have constructed new and improved AGC and modulation control circuitry including a power level feedback control loop suitably coupled between the output of a modulator/leveler stage and a variable attenuation control winding thereon. This loop provides a controlled attenuation of microwave or millimeter wave signals propagated through the modulator/leveler, and it features improved feedback signal comparison and clamping techniques to minimize signal delays through the feedback loop. Furthermore, this AGC loop also provides a visual indication of the power level of the microwave or millimeter wave signal propagated through the modulator/leveler.

My control circuitry also includes selectable external and automatic modulation control over the microwave or millimeter wave signals, and such control may be either digital or analog in nature. My control circuitry further features frequency marker control techniques for indicating the frequency or frequencies of the signals propagated through the modulator/leveler, and additionally my circuitry provides the necessary blanking signals for generating a baseline signal during retrace of the sawtooth wave generator which drives the main sweep oscillator. Other more specific and novel features of this control circuitry are described in further detail below.

Accordingly, it is an object of the present invention to provide new and improved control circuitry for a sweep oscillator and its associated modulator and leveling stage.

Another object is to provide control circuitry of the type described which introduces a minimum of delays into the signals processed in the closed feedback loop thereof.

Another object is to provide control circuitry of the type described which performs a relatively large number of separate electronic control and indication functions, while utilizing a relatively small number of electronic components.

A further object is to provide control circuitry of the type described which is reliable and durable in operation.

A feature of the present invention is the provision of a novel power level control loop in which bias current through a modulator control winding is varied in accordance with the level of the error signal generated in said loop.

Another feature is the provision of novel clamping circuitry within the power level control loop for minimizing signal delays and preventing overshoot and oscillations in said loop.

Another feature is the provision of power level indicator circuitry connected directly to the power level control loop and responsive to signals therein for providing a visual power level indication.

Another feature is the provision of a modulation control circuit which is also connected to the modulator/leveler in such a manner so as to require only a single modulation control winding. This circuit is operative in either the automatic or external modulation mode to drive the modulator/leveler at selected frequencies.

Another feature is the provision of frequency marker control circuitry for generating frequency marking pulses and applying same to the modulation control circuit.

A further feature resides in the generation of a baseline display signal during the retrace portion of the sawtooth voltage which drives the main sweep oscillator. During the retrace time of the sweep oscillator, it is desirable to provide maximum signal attenuation in the modulator/leveler by generating this baseline signal. This is accomplished by driving one end of the modulator control winding during sawtooth retrace.

These and other objects and features of the invention will become more readily apparent in the following description of the accompanying drawings.

DRAWINGS

FIG. 1 is a functional block diagram showing the control circuitry according to the invention. This figure includes, for sake of clarity, the conventional sweep oscillator, isolator, modulator/leveler and directional coupler stages with which the invention is used.

FIGS. 2*a* through 2*e* are waveform diagrams of typical voltage and power levels at various locations in the oscillator, modulator and associated control circuitry to be described.

FIGS. 3*a* through 3*d* are additional voltage waveform diagrams illustrating the periodic relationship between the leveling and level indicator signals on the one hand, and the blanking signals on the other.

DESCRIPTION OF PREFERRED EMBODIMENT

Figure 1:
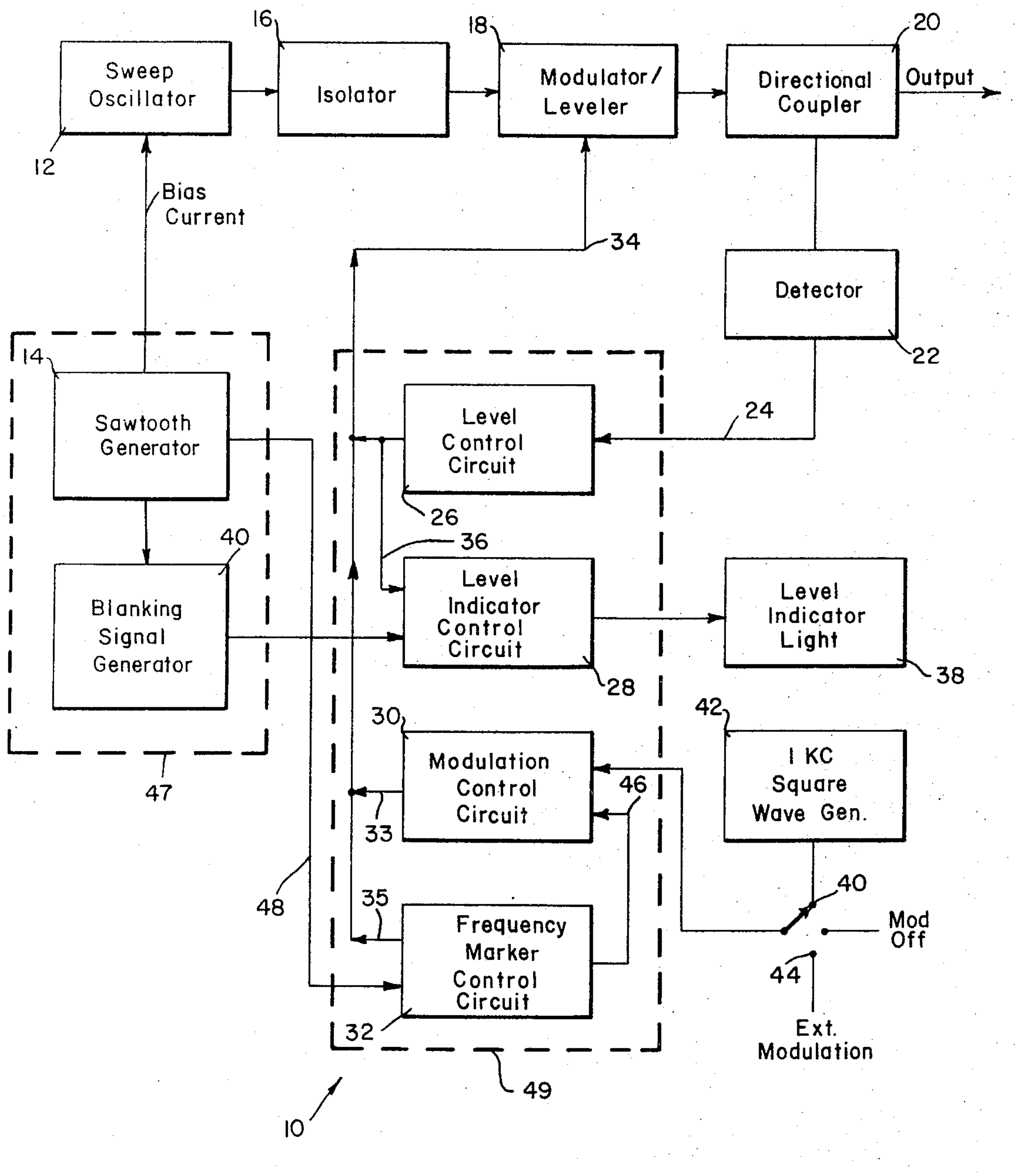

Referring now to FIG. 1, this complete microwave or millimeter wave generation system has been referred to by the Hughes Aircraft Company, applicants' assignee, as the "Super Sweeper" and it is indicated generally by the reference 10. This system includes a sweep oscillator 12 which is driven in a conventional manner by a sawtooth voltage generator 14, and the output (microwave or millimeter wave) signal which is coupled into the isolator stage 16 varies in frequency in accordance with the instantaneous amplitude of the driving sawtooth voltage from the sawtooth generator 14. Typically, the sweep oscillator 12 will include a solid state IMPATT diode mounted in a resonant cavity and operatively driven by a variable bias current. One suitable mounting and tuning arrangement for an IMPATT diode oscillator is disclosed and claimed in applicant's copending U.S. application Ser. No. 331,416. Thus, the IMPATT diode is biased for the generation of millimeter wave signals, the frequency of which is a direct function of bias current therethrough. This diode bias current is, in turn, directly proportional to the instantaneous amplitude of the sawtooth voltage from the sawtooth generator 14. For purposes of illustration herein, the signals generated, leveled, and modulated will be referred to as millimeter waves, but it is to be understood that the invention is not limited to millimeter waves and may also be used with various types of microwave oscillators.

Figure 5:
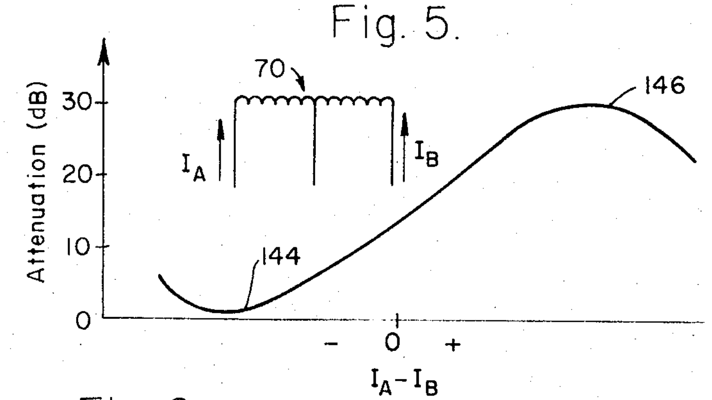
FIG. 5 illustrates the microwave power attenuation through the modulator/leveler stage as a function of the bias current applied to the modulator control winding.

The output of the isolator stage 16 is connected as shown to the input of the modulator/leveler stage 18, and the stage 18 includes a single control winding for modulation and leveling purposes (see FIG. 5). This control winding, which is not shown in FIG. 1, is conventionally connected coaxially with the waveguiding element (not shown) of the modulator/leveler 18 through which the millimeter waves pass. The magnetic field established therein by the control or bias current flowing in this winding provides a controllable attenuation of the millimeter waves. This control winding is also utilized to provide a controllable modulation of these millimeter waves which are coupled into the input of a conventional directional coupler stage 20.

A detector 22, such as a diode detector, is connected as shown to the directional coupler 20 in order to provide a detection voltage on line 24 which is applied to the input of a level control circuit 26. This control circuit 26, together with the level indicator control circuitry 28, the modulation control circuitry 30 and the frequency marker control circuitry 32 all comprise the complete control circuitry of my system which directly drives a single control winding in the modulator/leveler stage 18. The output signal of the level control circuit 26 is connected via line 34 to the control winding, previously mentioned, within the modulator/leveler stage 18. This same output signal is connected via line 36 to the input of the level indicator control circuitry 28, and the latter circuitry is connected to drive a level indicator light 38, such as a light emitting diode (LED). The circuit stages 26 and 28 are illustrated schematically in FIG. 4 below. The level indicator control circuit 28 is further connected as shown directly to a blanking signal generator 40, the function of which is described below. The blanking signal generator 40 provides rectangular output pulses (see FIG. 2*b*) which are triggered by and synchronized with the retrace voltage from the driving sawtooth generator 14.

The modulation control circuit 30 is selectively connectable to either the output terminal 40 of a 1 kilohertz signal generator 42 or to an external modulation terminal 44 to which an external modulation signal may be applied. The modulation control circuit 30 is further driven by one output 46 of the frequency marker control circuit 32, and the latter circuit stage 32 is also driven by the sawtooth voltage on line 48 from the sawtooth wave generator 14. Both the outputs 33 and 35 of the modulation control circuit 30 and the frequency marker control circuit 32, respectively, are connected directly via line 34 to the control winding of the modulator/leveler stage 18.

The level control circuit 26 is operative to compare the detection voltage on line 24 with a variable reference voltage and to generate an error signal on line 34 in response to such comparison. Generally speaking, this comparison technique per se using, for example, a differential amplifier is not new, but the specific circuit configuration for implementing such technique is believed novel.

The error signal generated in the level control circuit 26 is also utilized to control current conduction in the level indicator control circuit 28 and thus provide a visual indication at LED 38 of the millimeter wave power leveled in the modulator/leveler 18. There is no direct interaction between signals processed in the modulation control circuit 30 and those processed in the feedback loop 24-26-34, but this modulation control circuit 30, and the level control circuit 26 are both uniquely adapted for simultaneously driving the single control winding on on the modulator/leveler 18. The frequency marker control circuit 32 does interact via the connection 46 with the modulation control circuit 30, and it drives the modulator/leveler 18 to produce baseline generation and a frequency indication in the scope display of the swept frequency millimeter wave signal. The exact nature and function of the entire control circuitry 49, illustrated in FIG. 1, will become apparent below with reference to the specific schematic diagrams in FIGS. 4 through 7. These schematic diagrams will be functionally described with some reference to the waveform diagrams shown in FIGS. 2 and 3. Therefore, initially, the relationships of the waveform diagrams in FIGS. 2 and 3 will be briefly identified, with a more complete understanding of these relationships to come in the subsequent detailed description of the circuit embodiments in FIGS. 4–7.

Figure 2:
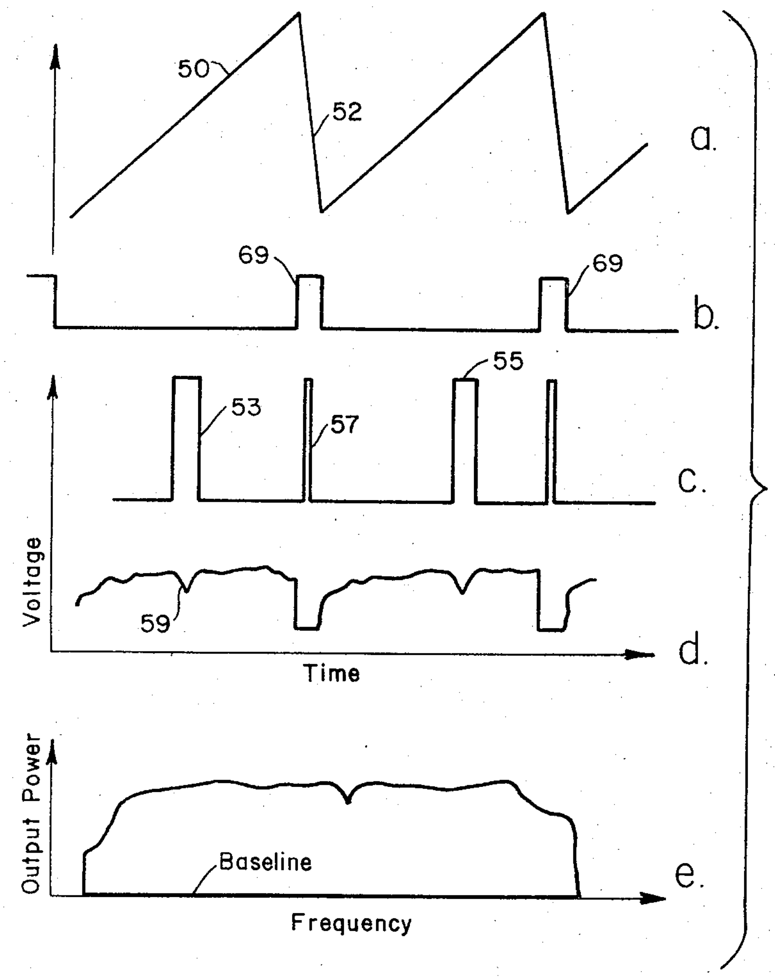

Referring now to FIG. 2, there is shown in FIG. 2a the periodic sawtooth voltage waveform at the output of the sawtooth generator 14. This waveform has a trace portion 50 and a retrace portion 52, as is well known. The blanking signals 69 in FIG. 2b are generated periodically during the retrace portion 52 of the sawtooth voltage waveform, and these signals in FIG. 2*b* are used both for driving the level indicator control circuit 28 and for generating a baseline to a scope trace during each retrace portion of the sawtooth voltage.

The periodic pulse signal illustrated in FIG. 2c is that pulse at the output 46 of the frequency marker control circuit 32, and this pulse drives the modulation control circuit 30 in a manner to be described to provide a frequency indication of the millimeter wave signals.

The waveform in FIG. 2d is the power leveled millimeter wave signal propagated through the modulator/leveler 18, with the V-shaped frequency mark in this waveform caused by the output pulse train shown in FIG. 2*c*. Finally, the graph in FIG. 2*e* is the output power-versus-frequency characteristic of the system in FIG. 1 as it appears on an oscilloscope or the like. The baseline trace indicated therein is generated by the blanking pulses in FIG. 2*b* which are applied to one end of the modulator/leveler 18 control winding during each sawtooth retrace of the sawtooth generator 14.

Figure 3:
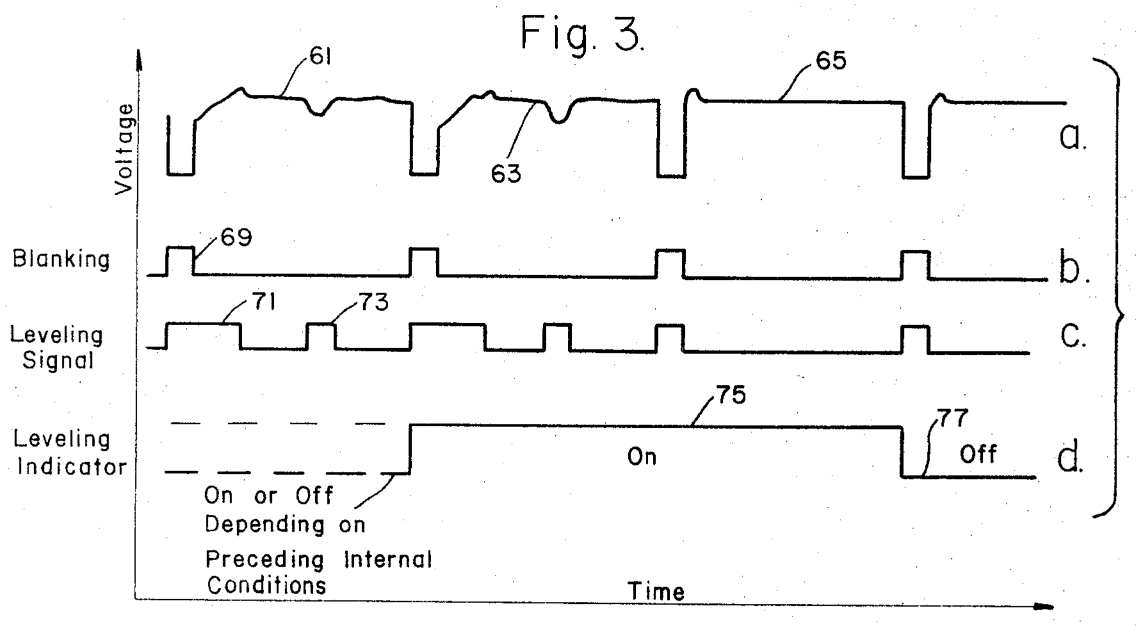

The waveforms in FIGS. 3*a* and 3*b* correspond directly to the respective waveforms in FIGS. 2*d* and 2*b* above previously described, and the additional waveforms in FIGS. 3*c* and 3*d* are presented to illustrate the leveling, control and indication functions of the two stages 26 and 28. These waveforms in FIGS. 2 and 3 will be discussed in more detail below.

Figure 4:
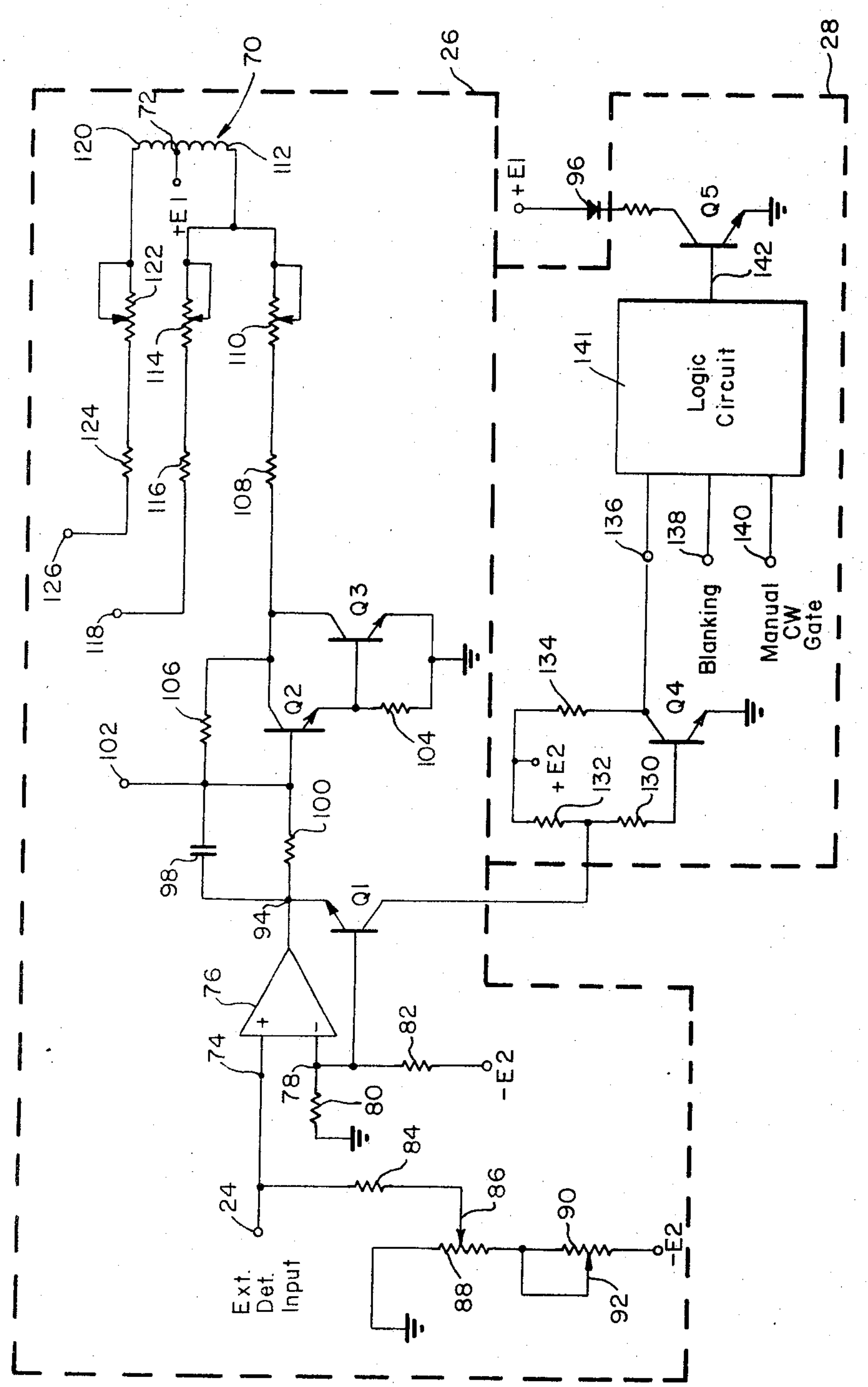
FIG. 4 is a schematic diagram of the level control and indicator circuitry according to the invention.

Referring now to FIG. 4, there is illustrated schematically the level control circuit 26 and the level indicator control circuit 28 which were previously identified functionally with reference to FIG. 1. The circuit 26 constitutes the detection signal feedback loop between the output 24 of the detector 22 and the control winding 70 on the modulator/leveler 18. This control winding 70 has a center tap 72 thereon to which is connected a positive supply voltage $E_1$, and the variable attenuation characteristic of this control winding is described further below with reference to FIG. 5.

The output of the detector 22 is directly connected as shown to one input 74 of a differential operational amplifier 76. In the present embodiment, the detector 22 includes a silicon diode connected in series with a resistive load (not shown) across which a varying detection voltage is developed. The other input 78 of the amplifier 76 is connected through an input resistor 80 to ground potential and also through a bias resistor 82 to a negative supply voltage $-E_2$.

The signal input 74 is further connected through a current-limiting resistor 84 to a variable tap 86 on a level control resistor 88. Further, a detector sensitivity adjust resistor 90 is connected as shown with a variable tap 92 and between resistor 88 and a negative supply voltage $-E_2$. The operational amplifier 76 is biased to switch when the input voltage from the detector 22 and appearing at the negatively biased terminal 74 exceeds ground potential. In the above-described circuitry, the combination of the two variable resistors 88 and 90 enables the reference voltage applied to the amplifier input 74 to be varied over a broad range of input power, with a wide range of detector sensitivity. Further, the combination of the two resistors 80 and 82 enables this reference voltage at 78 to compensate for the "turn-on" or "offset" voltage of the diode within the detector stage 22. That is, the voltage drop across resistor 80 is set equal to that of the offset voltage of the diode detector, which for silicon is typically 0.6–0.7 volt. In this manner, the operational amplifier 76 can be biased to switch when the detected output power exceeds the very low threshold level on the negative input terminal 78.

A unique clamping arrangement utilizing an NPN clamping transistor $Q_1$ is provided as shown between the output terminal 94 and the one input terminal 78 of the operational amplifier 76. The transistor $Q_1$ conducts a small feedback bias current during the time that the output voltage of the operational amplifier 76 is below the reference level at input node 78. In this manner, the transistor $Q_1$ clamps the output voltage of the operational amplifier 76 at one base-emitter drop ($1V_{BE}$) below the voltage at node 78 and prevents the output voltage at node 94 from swinging too far negative. This clamping ensures that undue delays will not be introduced into the feedback signals through the operational amplifier 76 in the case of large detection voltage swings applied to the operational amplifier 76.

In addition to the above, the clamping transistor $Q_1$ provides a very useful switching function in the control signal path to the level indicator control circuit 28. Thus, $Q_1$ responds to input detection voltages at the operational amplifier 76 to control the current flow to the light-emitting diode (LED) 96, as will be further described.

The operational amplifier's output signal at node 94 is coupled through the RC network consisting of capacitor 98 and resistor 100 and to the input of the Darlington-connected transistor pair $Q_2$ and $Q_3$. The capacitor 98 provides a low impedance in the signal path of the circuit 26 for a rapidly changing detection voltage and thus prevents overshoots and oscillations in the operational amplifier circuitry 76. The base electrode of input Darlington transistor $Q_2$ is further connected via terminal 102 to one output of the modulation control circuit 30, and the reason for this connection will become apparent below in the description of the modulation control circuit in FIG. 6.

The Darlington-connected transistors $Q_2$ and $Q_3$ are connected directly in cascade in a conventional fashion and further are provided with appropriate bias resistors 104 and 106. The collector of $Q_3$ is connected through a fixed resistor 108 and through a variable feedback gain adjustment resistor 110 to one end 112 of the modulator/leveler control winding 70. Thus, the error signal at node 94 is appropriately amplified to control the collector current of $Q_3$, and the latter current, in turn, determines the level of control current flowing in the control winding 70. Thus, the attenuation provided by the control winding 70 is varied in closed loop fashion in accordance with the error signal level at the output of the operational amplifier 76.

The lower end 112 of the control winding 70 is further connected through a maximum isolation adjustment resistor 114 and through another fixed resistor 116 to one push-pull output connection 118 of the modulation control circuit 30. The other end 120 of the control winding 70 is connected through a minimum insertion loss adjustment resistor 122 and through another fixed resistor 124 to a second push-pull output terminal 126 of the modulation control circuit 30. The outputs 118 and 126 of the modulation control circuit 30 provide a push-pull modulation voltage for driving the control winding 70, and the utilization and connection of the control winding 70 as shown in FIG. 4 enables a single control winding to respond appropriately to both the feedback error signal generated in FIG. 4 and also to the push-pull modulation voltage provided by the modulation control circuit of FIG. 6.

Referring now to the level indicator control circuit 28 in FIG. 4, the transistor $Q_1$ controls the conductivity of the transistor $Q_4$, so that when $Q_1$ is off, $Q_4$ is on, and vice versa. Thus, if $Q_1$ is clamping during a leveling operation, then $Q_4$ is turned off to generate one appropriate signal condition at the input of the logic circuit 128 necessary to turn on the output NPN transistor $Q_5$. When $Q_5$ turns on, the light emitting diode 96 is energized to indicate the condition when either: (1) a portion 61 of one sweep cycle is unleveled as indicated in FIG. 3 and under the automatic sweep mode of operation, or (2) when the output power from the directional coupler 20 is below the threshold level, under the manual cw mode of operation. Transistor Qhd 4 is connected in a conventional DC bias arrangement including resistors 130, 132 and 134 so that $Q_4$ is maintained cut off when $Q_1$ is turned on. The collector of $Q_4$ is connected as shown directly to one input 136 of the logic circuit 128, and additional blanking and manual mode inputs 138 and 140, respectively, are also connected to control the operation of the logic circuit 128.

Using positive logic, a high level signal at the output connector 142 of the logic circuit 141 and necessary to turn on $Q_5$ indicates that the millimeterwave power through stage 18 is below the threshold level. This condition occurs during the coincidence of a low logic signal at terminal 136 ($Q_4$ turned off), under the manual cw mode of operation. For this condition, a high level signal is present at terminal 140. Under the manual sweep mode of operation or the cw mode of operation, during which time signals are applied to terminal 140, the indicator control circuit 28 detects the leveling signal only at a specific frequency of operation. When the millimeter-wave power exceeds the threshold level under the said manual cw condition, $Q_5$ will be turned off.

Operating in the automatic sweep mode of operation, the manual cw signal at 140 remains at a low level and the indicator control circuit 28 detects the leveling signal generated by the transistor $Q_1$ and turns on $Q_5$ when levelling and blanking signals 69 and 71 respectively (FIG. 3) occur in a proper sequence. $Q_5$ turns on when a leveling signal 71 is missed between successive blanking signals 69 indicating that the millimeter-wave output is completely leveled for the entire sweeping range as noted at reference 65.

Thus, the circuit 28 offers the unique feature of providing two modes of level indication: the power level indicator LED 96 turns on at the leading edge of pulse 75 if any portion 63 of the sweeping range is unleveled under the automatic sweep mode of operation. And, under the manual sweep mode of operation, the level indicator 96 is turned off to indicate leveling only at a specific frequency.

Referring now to FIG. 5, the graph of dB attenuation versus differential control current ($I_a - I_b$) flowing in the control winding 70 illustrates the characteristic attenuation of this winding in the present circuits. This curve progresses from a point 144 where ($I_a - I_b$) is set to provide a minimum attenuation to a point 146 where ($I_a - I_b$) is set to provide a maximum attenuation. Thus, the variation in attenuation through the modulator/leveler stage 18 is a direct function of the net bias current ($I_a - I_b$) through the control winding 70. The sum ($I_a - I_b$) will, of course, be controlled in an analog fashion by the control loop illustrated in FIG. 4 and controlled in a periodic fashion by the modulation control circuit illustrated in FIG. 6. The latter circuit provides the push-pull modulation voltage at input terminals 118 and 126 which are directly connected to opposite ends 112 and 120 of the control winding 70 as previously described.

Figure 6:
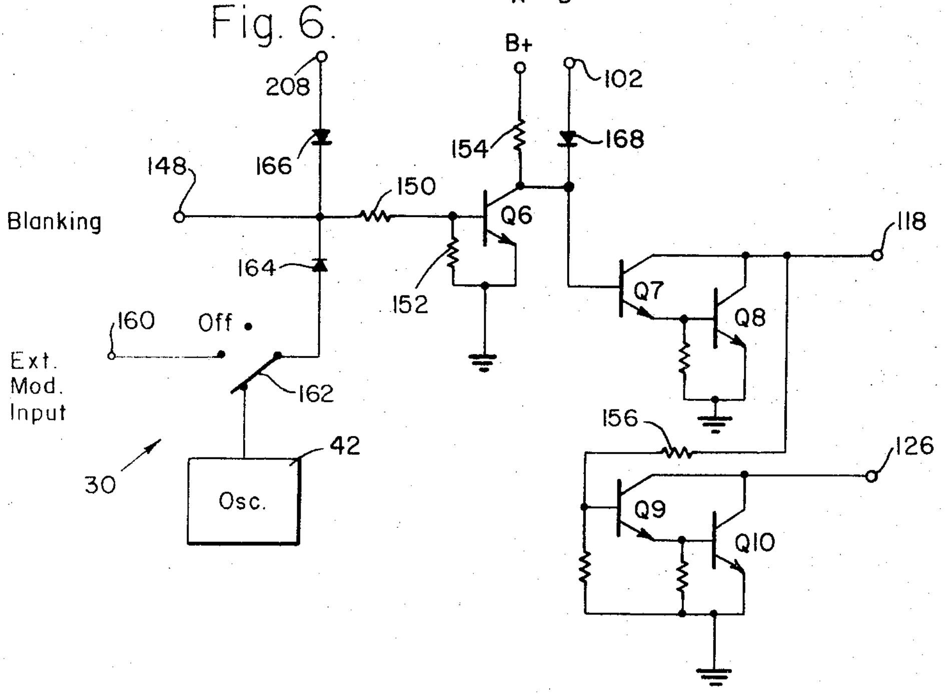
FIG. 6 is a schematic diagram of the modulation control circuit according to the invention.

Referring now to the modulation control circuit 30 illustrated schematically in FIG. 6, a blanking signal input terminal 148 is connected to one end of an input current limiting resistor 150, whose other end is connected to the base of $Q_6$. This transistor $Q_6$ is also connected to a base pulldown resistor 152 and through a collector load resistor 154 to a supply voltage $+E_1$ as shown. The collector output of the normally non-conducting $Q_6$ is directly connected to a first Darlington connected transistor pair $Q_7$, $Q_8$. This latter Darlington connected NPN transistor pair is cascaded via a current limiting resistor 156 to the base of NPN transistor $Q_9$, which forms with NPN transistor $Q_{10}$ a second Darlington connected transistor pair. The above described Darlington transistor pairs are alternately driven to conduction and non-conduction as the input transistor $Q_6$ is switched to conduction and non-conduction during the presence and absence, respectively, of positive blanking pulses FIG. 2b coupled to the base of $Q_6$. These Darlington connected pairs $Q_7$, $Q_8$ and $Q_9$, $Q_{10}$ provide the push-pull output voltage at terminals 118 and 126 as previously mentioned for driving opposite ends 112 and 120 of the control winding 70. Thus, when transistor $Q_6$ is turned on, the base of transistor $Q_7$ is driven to approximately ground potential to thereby cause $Q_7$ and $Q_8$ to turn off. When $Q_8$ turns off, its collector swings high to drive $Q_9$ and $Q_{10}$ to conduction, so that for this condition, output terminal 118 swings high and output terminal 126 swings to approximately ground potential. The voltage levels at these two output terminals 118 and 126 reverse when the input transistor $Q_6$ becomes non-conductive during the absence of blanking signals applied to its base.

The input transistor $Q_6$ may be conductively controlled either by the presence of blanking signals at the input terminal 140, by the application thereto of a square wave output voltage from the 1 kilohertz square wave generator 42, or thirdly by an external modulation voltage applied to the input terminal 160. A switch 162 is advantageously used to couple either the 1 kilohertz square wave modulation voltage or the external modulation voltage through a blocking diode 164 to the base of $Q_6$. Another blocking diode 166 is connected between the blanking input terminal 148 and the output terminal 208 of the frequency marker control circuit 32. Thus, the output pulses from the circuit 32 also control the conduction of $Q_6$ in a manner described below. Yet a third blocking diode 168 interconnects the collector of $Q_6$ to terminal 102 at the base of $Q_3$ in FIG. 4. This latter connection prevents $Q_2$ and $Q_3$ from turning on when $Q_6$ turns on.

If both transistor $Q_3$ and transistor $Q_{10}$ were turned on simultaneously, for example, when blanking and leveling occur simultaneously, and in the absence of the diode 168 connection described above, the bias current of the modulator leveler control winding 70 would swing beyond the maximum attenuation point shown in FIG. 5. This would result in an undesirable positive feedback control, resulting in unleveled millimeter wave output power. However, in accordance with the present invention, the collector voltage of transistor $Q_6$ prevents this possibility by turning off $Q_2$ when its collector goes to ground potential as $Q_6$, $Q_9$ and $Q_{10}$ simultaneously conduct. $Q_2$ and $Q_3$ remain turned off during this time and until $Q_6$ (FIG. 6) is again switched to non-conduction.

Figure 7:
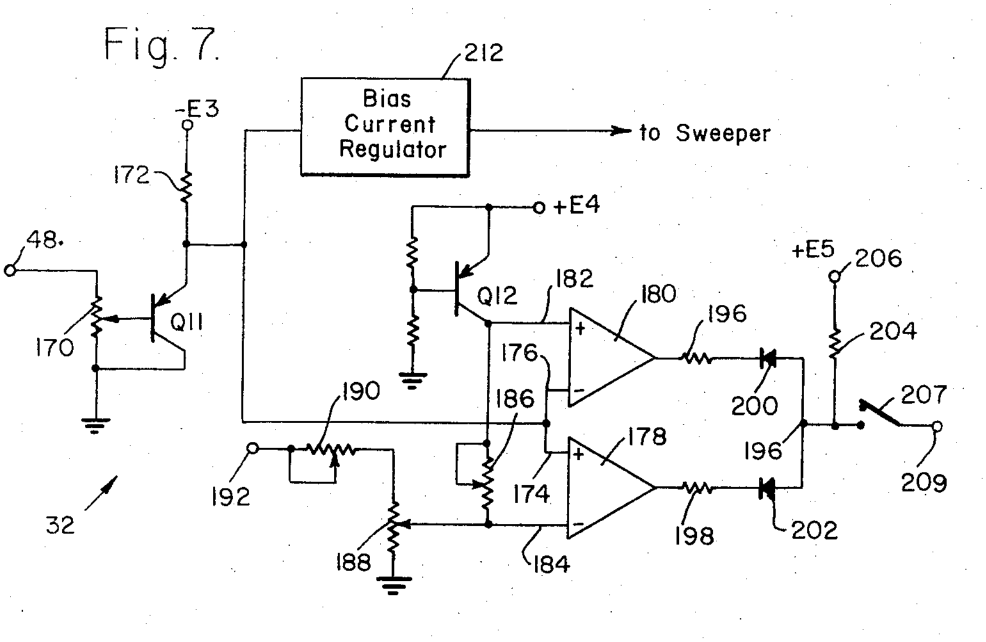
FIG. 7 is a schematic diagram of the frequency marker control circuit according to the invention.

Referring now to FIG. 7, the frequency marker control circuit 32 illustrated schematically therein includes an input PNP transistor $Q_{11}$ which is connected as shown to a variable base bias input resistor 170. The emitter output of $Q_{11}$ is connected through a load resistor 172 to a voltage supply $+E_3$, and the emitter of $Q_{11}$ is further connected directly to the positive and negative input terminals 174 and 176, respectively, of two differential operational amplifiers 178 and 180. The positive input terminal 182 for the amplifier 180 is connected as shown to receive a variable reference threshhold voltage, and similarly, the negative input terminal 184 of the amplifier 178 is connected to receive a variable reference threshold voltage at the variable tap on resistor 188. The resistor 188, the variably tapped resistor 186 and the current source transistor $Q_{12}$ are connected in a resistive bias string between the supply voltage $+E_4$ and ground potential, and the threshold voltage at the amplifier input terminals 182 and 184 may be varied by means of the taps on resistors 186 and 188.

Each of the operational amplifiers 178 and 180 is connected through an output resistor 196 and 198 respectively and an output diode 200 and 202 respectively to the aforementioned frequency marker output terminal 196, and further, this output terminal 196 is connected through a common load resistor 204 to a supply voltage $+E_5$ at terminal 206. A bias current regulator stage 212 is connected between the emitter output of $Q_{11}$ as shown and the input of the sweep oscillator 12, and this stage 212 is operative to provide a proper bias current range to the sweep oscillator to achieve a desired frequency range of oscillation.

Thus load current from $+E_5$ and through load resistor 204 will flow through one of the two series paths 196,200 or 198,202 into the operational amplifiers 180 and 178 respectively during the threshold switching of these amplifiers as described below.

The differential operational amplifiers 178 and 180 are driven in the following manner by the emitter follower sawtooth voltage at $Q_{11}$ to generate a frequency marker output pulse at node 196: If the sawtooth voltage at terminals 174 and 176 is both less than the voltage at terminal 182 and more than the voltage at terminal 184, the voltage outputs of both of these operational amplifiers swing high (using positive logic) to back bias the diodes 200 and 202 and drive the point 196 high, generating the leading edge of a frequency marker pulse 53 in FIG. 2c.

However, when the instantaneous sawtooth voltage increases further to exceed the voltage on terminal 182, the output of amplifier 182 swings negative, generating the trailing edge of the frequency marker pulse 53. These pulses are shown as the first and third pulses in FIG. 2*c* and correspond to the V-shaped disturbances in the voltage waveform in FIG. 2d.

The input terminal 184 is set at a voltage slightly lower than that on terminal 182 for the above described switching operation, and the reference voltage at terminal 184 can be varied, of course, to in turn vary the frequency marker pulse width. This reference voltage can be adjusted by varying the position of the movable tap on resistor 186. The variable taps on resistors 188 and 190 are utilized to compensate for variations in the frequency of the sweep oscillator 12, so that a full scale movement of the tap on resistor 188 can be made to correspond to a full sweep range of the oscillator 12. The tap on resistor 188 can be varied to change the sawtooth voltage level at which the frequency marker pulse begins, whereas the tap on 186 controls the frequency marker pulse width.

What is claimed is:

1. Circuitry for sweeping the frequency of a solid state diode type oscillator through a predetermined frequency range while simultaneously controlling the amplitude of microwave or millimeter wave power generated by said oscillator, said circuitry including in combination:

a. a waveguide modulator electrically coupled to said oscillator and having a control winding thereon for receiving bias currents for varying the attenuation of microwave power passing therethrough,
b. detection means coupled to said waveguide modulator and providing a detection voltage proportional to the level of microwave power propagated through said waveguide modulator,
c. differential amplifier means having one input thereof connected to said detection means for receiving said detection voltage and the other input thereof connected to a variable threshold reference voltage, whereby said voltages are compared to generate an error signal, and
d. means connecting the output of said differential amplifier means to a point on said control winding for thereby coupling said error signal to said modulator and providing closed loop feedback control of the microwave power propagated through said modulator.

2. Circuitry defined in claim 1 which further includes means connected between a reference input terminal and an output terminal of said differential amplifier means for clamping the output voltage of said differential amplifier means to a predetermined DC level, thereby preventing signal delays and minimizing overshoot in said differential amplifier means and preventing instability in said amplifier means when the RF power levels through said modulator exceed predetermined values.

3. Circuitry defined in claim 2 wherein said clamping means includes a transistor which has its emitter-base junction connected between the input and output terminals of said differential amplifier means and its base-collector junction serially connected through suitable logic circuitry to a visual indicator means, whereby said transistor serves the dual purpose of properly clamping said differential amplifier means to prevent signal delays and also controlling the energization of said indicator means to indicate the level of the signal passing through said modulator.

4. Circuitry defined in claim 1 which further includes modulation control circuitry having:

a. an external modulation input terminal for receiving an external modulation voltage,
b. an internal modulation input terminal connectable to a fixed frequency generator for receiving an on/-off modulation signal, and
c. push-pull amplifier means selectively connectable to one of said external and internal modulation input terminals and having a pair of push-pull output terminals connected to drive said control winding of said modulator in a push-pull fashion, thereby providing on-off and manual modulation control of microwave power passing through said waveguide modulator.

5. Circuitry defined in claim 1 which further includes frequency marker control circuitry having:

a. input sweep width control amplifier means connected to receive a sawtooth voltage whose amplitude is proportional to the frequency of said oscillator, and
b. threshold switching means coupled to the output of said input amplifier means for generating output pulses whose spacing is dependent upon the frequency of said sawtooth voltage and said oscillator, whereby said pulses may be utilized to control the current flowing in said control winding and thereby provide a frequency indication for said oscillator.

6. The circuitry defined in claim 5 wherein said frequency marker control circuit further includes a bias current regulator network connected between the output of said input amplifier means and said oscillator for providing an adjustable sawtooth bias current to said oscillator, thereby providing variable frequency control for the latter.

7. Circuitry defined in claim 6 which further includes modulation control circuitry having:

a. an external modulation input terminal for receiving an external modulation voltage,
b. an internal modulation input terminal connectable to a fixed frequency generator for receiving an on-off modulation signal, and
c. push-pull amplifier means selectively connectable to either said external or to said internal modulation terminal and having a pair of push-pull output terminals connectable to said control winding of said waveguide modulator for providing on-off and manual modulation control of microwave power propagated through said waveguide modulator.

8. Circuitry defined in claim 7 which further includes means connected between the reference input terminal and the output terminal of said differential amplifier means for DC clamping the output voltage of said differential amplifier means to a predetermined level, thereby preventing signal delays in said circuitry when the detection voltage from said detection means rapidly exceeds a predetermined level.

9. Circuitry defined in claim 8 wherein said clamping means is a transistor having its emitter-base junction connected between the input and output terminals of said differential amplifier means and having its base-collector junction serially connected via suitable logic circuitry to a visual level indicator means for controlling the current thereto, whereby said clamping transistor serves the dual purpose of DC clamping the output voltage of said differential amplifier means and also controlling the current to said visual indicator means to indicate the leveling of microwave power passing through said modulator.

10. The circuitry defined in claim 1 wherein said oscillator is an IMPATT diode type oscillator whose output frequency varies as a function of D.C. bias current through an IMPATT diode.

11. Control circuitry for sweeping the frequency of a solid state diode type oscillator through a predetermined frequency range and operative for modulating and leveling microwave or millimeter wave power generated at said oscillator, said circuitry including in combination:

a. a waveguide modulator having a control winding thereon for receiving bias currents to vary the attenuation of microwave power propagated therethrough,
b. detection means coupled to the output of said waveguide modulator for providing a detection voltage proportional to the power level at the output of said waveguide modulator,
c. means coupled to said detection means for comparing said detection voltage with a variable reference voltage to thereby generate a closed loop feedback error signal,
d. means coupling said error signal to said control winding, and
e. modulation control circuit means connected to selected points on said winding for providing fixed frequency or other modulation control thereto, whereby a single control winding may be used to receive both a closed loop error signal and an open loop modulation signal.

12. Circuitry defined in claim 11 wherein:

a. said modulation control circuit means has an external modulation input terminal for receiving a manual mode modulation voltage and also has an internal modulation input terminal connectable to a fixed frequency generator for receiving an periodic modulation signal, and
b. said modulation control circuit means further including push-pull amplifier means selectively connectable to said external and to said internal modulation input terminals and having a pair of push-pull output terminals connected, respectively, to separate points on said control winding for providing automatic on-off and external modulation control of microwave power propagated through said waveguide modulator.

13. Circuitry defined in claim 11 wherein:

a. said comparing means includes a differential amplifier having one input terminal connected to said detection means for receiving said detection voltage and another input terminal connected to a variable reference threshold voltage for controlling the threshold response of said differential amplifier, and
b. means coupling the output of said differential amplifier to said control winding for providing the close-loop feedback control of microwave power propagated through said modulator.

14. Circuitry defined in claim 11 which further includes frequency marker control circuitry having:

a. input amplifier means connected to receive a sawtooth voltage whose amplitude is proportional to the output frequency of said oscillator, and
b. threshold switching means connected to the output of said input amplifier means for generating output pulses whose pulse spacing is dependent upon the amplitude of said sawtooth voltage and the frequency of said oscillator, whereby said pulses may be utilized to control the current in said control winding and provide a microwave frequency marker indication on an oscilloscope.

15. Circuitry defined in claim 14 wherein said frequency marker circuitry includes a bias current regulator network connected between the output of said input amplifier means and the said oscillator for providing a variable reference bias current to the said oscillator, said bias current controlling the frequency of said oscillator.

16. Circuitry defined in claim 14 wherein:

a. said comparing means includes a differential amplifier having one input thereof connected to receive said detection voltage and another input thereof connected to a variable reference threshold voltage for controlling the threshold response of said differential amplifier, and
b. means coupling the output of said differential amplifier to said control winding to provide closed loop feedback control of the microwave power propagated through said modulator.

17. Circuitry defined in claim 16 which further includes means connected between a reference input terminal and an output terminal of said differential amplifier means for clamping the output voltage of said differential amplifier means to a predetermined DC level, thereby preventing signal delays through said differential amplifier means when the RF power levels through said modulator rapidly exceed predetermined levels.

18. Circuitry defined in claim 17 wherein said clamping means includes a transistor which has its emitter-base junction connected between the input and output terminals of said differential amplifier means and its base-collector junction serially connected via suitable logic circuitry to a visual indicator means, whereby said transistor serves the dual purpose of properly clamping said differential amplifier means to prevent signal delays and also controlling the energization of said indicator means to indicate the power leveling of the signal passing through said modulator.

* * * * *